United States Patent
Bagung et al.

(10) Patent No.: US 6,201,710 B1
(45) Date of Patent: Mar. 13, 2001

(54) HOUSING CONFIGURATION FOR A PRINTED CIRCUIT BOARD EQUIPPED WITH COMPONENTS

(75) Inventors: Detlev Bagung, Bernhardswald; Gunter Ludwig, Schwarzenbruck, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/246,669

(22) Filed: Feb. 5, 1999

(30) Foreign Application Priority Data

Feb. 5, 1998 (DE) .............................. 198 04 590

(51) Int. Cl.$^7$ ................. H05K 7/04; H05K 9/00
(52) U.S. Cl. ............... 361/799; 361/752; 361/801; 174/51; 439/95; 24/563
(58) Field of Search .................. 361/752, 753, 361/796, 799, 801, 802, 816; 439/95; 174/51; 206/719; 24/563

(56) References Cited

U.S. PATENT DOCUMENTS

| | | | |
|---|---|---|---|
| 5,343,361 | * | 8/1994 | Rudy, Jr. ................. 361/710 |
| 5,513,996 | * | 5/1996 | Annerino et al. ........... 439/95 |
| 5,603,620 | * | 2/1997 | Hinze et al. ............... 439/95 |
| 5,747,735 | * | 5/1998 | Change et al. ............. 174/51 |
| 6,000,956 | * | 12/1999 | Henningsson et al. ........ 439/95 |

FOREIGN PATENT DOCUMENTS

| | | |
|---|---|---|
| 3790062C2 | 1/1988 | (DE) . |
| 9109072 | 12/1991 | (DE) . |
| 0557545A1 | 9/1993 | (EP) . |

OTHER PUBLICATIONS

Published International Application No. 96/19098 (Henningsson et al.), dated Jun. 20, 1996.

* cited by examiner

Primary Examiner—Jayprakash N. Gandhi
(74) Attorney, Agent, or Firm—Herbert L. Lerner; Laurence A. Greenberg; Werner H. Stemer

(57) ABSTRACT

A housing configuration for a printed circuit board equipped with components, includes a housing with at least partially metallic housing walls as well as at least one metallic spring profile element. The spring profile element has a first and a second profile leg, which are connected to one another forming an essentially V-shaped profile cross section, and is inserted into a gap region between an edge of the printed circuit board and the housing wall. The first profile leg is connected to a ground terminal of the printed circuit board, and the second profile leg exerts an elastic spreading force as it bears against the housing wall and makes electrical contact with the latter.

9 Claims, 2 Drawing Sheets

HOUSING CONFIGURATION FOR A PRINTED CIRCUIT BOARD EQUIPPED WITH COMPONENTS

BACKGROUND OF THE INVENTION

Field of the Invention

The invention relates to a housing configuration for a printed circuit board equipped with components, including a housing with at least partially metallic housing walls as well as at least one metallic spring profile element, the spring profile element having a first and a second profile leg connected to one another forming an essentially V-shaped profile cross section, the first profile leg being electrically connected to a ground terminal of the printed circuit board, and the second profile leg exerting an elastic spreading force as it bears against the housing wall and makes electrical contact with the latter.

In many areas of technology, electrical equipment must satisfy increasingly more stringent requirements with regard to electromagnetic compatibility (EMC). A measure which is already known for that purpose is electrically connecting a ground terminal of a printed circuit board (EMC ground) to a metal housing that accommodates the printed circuit board, and achieving electromagnetic shielding as a result thereof.

European Patent Application 0 557 545 A1 describes a housing for equipment appertaining to electrical communications technology, which has a chamber-like structure created by inner housing walls. The electromagnetic shielding by the housing is achieved by virtue of the fact that contact strips are provided on the printed circuit board. Profiles of the contact strips correspond to contours of the chamber walls. The contact strips are provided with contact springs which project upward in an inclined manner and contact pins that are bent away perpendicularly downward. That solution is structurally complex and requires high dimensional stability for the fitting of the contact strips. Moreover, it is disadvantageous that the contact strips have to be attached to the printed circuit board before the latter is inserted into the housing.

German Utility Model G 91 09 072.5 describes a housing for a hand-held radio telephone, in which the electromagnetic shielding is effected by a metallic shielding plate which covers the printed circuit board. The shielding plate has feathered edges which make electrical contact with the housing shell when the latter is put in place.

A housing configuration which is constructed as set forth initially above is described in International Patent Application WO 96/19098. In order to ground a circuit board, that document proposes the use of a U-shaped spring element which is fixed by one of its legs to the circuit board, bridges a gap between the circuit board, and at the same time bears against the housing wall with its other leg. A vertex of the U in that case is disposed above the circuit board.

A further metallic grounding spring is described in German Patent DE 37 90 062 C2.

SUMMARY OF THE INVENTION

It is accordingly an object of the invention to provide a housing configuration for accommodating an electrical circuit having a printed circuit board equipped with components in a housing, which overcomes the hereinaforementioned disadvantages of the heretofore-known devices of this general type, which enables a printed circuit board ground to make contact with the housing in a structurally simple and effective manner and which furthermore allows high flexibility in the course of carrying out an assembly sequence.

With the foregoing and other objects in view there is provided, in accordance with the invention, a housing configuration for a printed circuit board equipped with components and having an edge, end surfaces and a ground terminal, comprising a housing having an at least partially metallic housing wall defining a gap region between the housing wall and the edge of the printed circuit board, the housing having at least one metallic spring profile element inserted into the gap region; the spring profile element having a first profile leg and a second profile leg connected to one another forming a substantially V-shaped profile cross section; the first profile leg electrically connected to the ground terminal of the printed circuit board and bearing against one of the end surfaces of the printed circuit board; and the second profile leg exerting an elastic spreading force while bearing against and electrically contacting the housing wall.

The pressure force effected by the V-shaped cross section of the spring profile element ensures permanent and ample bearing of the second profile leg against the inner wall surface of the housing and, at the same time, ensures the required low-resistance contact-making between the printed circuit board ground and the housing. At the same time, the V-shaped profile cross section enables tolerance compensation of a gap dimension between the printed circuit board and the housing. That affords advantages in terms of production engineering, particularly when different printed circuit board or housing dimensions occur during production.

In accordance with another feature of the invention, the first profile leg has a bulge which engages behind the underside of the printed circuit board in the inserted state. The effect achieved by the bulge of the first profile leg engaging behind the underside of the printed circuit board is that the spring profile element latches in the gap region between the housing wall and the printed circuit board and a stop piece rests with a defined pressure on the ground terminal of the printed circuit board. A reliable mechanical fit and good electrical contact-making are ensured in this way.

A further advantage is the fact that the spring profile element can be fitted only after all of the functional tests have been carried out, at the end of the assembly sequence. Consequently, housing configurations without a spring profile element can be subsequently equipped in a simple manner with the element without necessitating the disassembly of the electrical circuit configuration with a printed circuit board for this purpose.

In principle, the first profile leg can be electrically connected to the printed circuit board ground in a variety of ways.

In accordance with a further feature of the invention, the first profile leg is provided, on its leg end, with a stop piece which protrudes essentially at right angles from the profile leg and is seated on the ground terminal provided on the surface of the printed circuit board. In terms of production engineering, it is then possible to solder the spring profile element to the ground terminal of the printed circuit board at the stop element before the printed circuit board is incorporated into the housing. In this case, the printed circuit board is inserted into the housing with the spring profile element which is already fixedly connected to the printed circuit board, and contact between the spring profile element and the housing wall is made automatically.

As already mentioned, however, the inventive spring profile element with the stop piece also enables a different assembly sequence, which is advantageous particularly when it is important for the housing configuration according to the invention to have high ease of repair and capability of reassembly. In this case, the spring profile element is not pressed into the gap region between the housing and the printed circuit board until after the assembly of the electrical circuit configuration. The stop piece in combination with the bulge of the first profile leg which engages under the circuit board as well as the spreading effect of the spring profile element ensures the correct end position of the spring profile element and simultaneously forms the electrical contact with the ground terminal.

In accordance with an added feature of the invention, the second profile leg is provided with transverse recesses, which are worked into the profile leg from the longitudinal edge of the leg. This increases the flexibility of the second profile leg in the longitudinal direction, thereby obtaining constant, and consequently low-resistance, bearing of the second profile leg along the housing wall even if the housing should have any slight wall curvatures.

In accordance with an additional feature of the invention, particularly permanent mechanical fixing of the second profile leg to the housing wall is achieved if the second profile leg is provided, on its edge, with a sharp-edged holding lip, in particular a burr from stamping, that protrudes on the housing side. During the insertion of the spring profile element (either during assembly of the printed circuit board or subsequently), the sharp-edged holding lip cuts into the housing material like a knife and thus increases the mechanical strength of the spring fit as well as the electrical conductivity of the contact-making.

In accordance with a concomitant feature of the invention, the shielding effect of the housing configuration is increased if the spring profile element is provided in the region of a housing connector. Particularly short conduction paths between the ground terminal of the printed circuit board and the housing connector are afforded in this case.

Other features which are considered as characteristic for the invention are set forth in the appended claims.

Although the invention is illustrated and described herein as embodied in a housing configuration for a printed circuit board equipped with components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
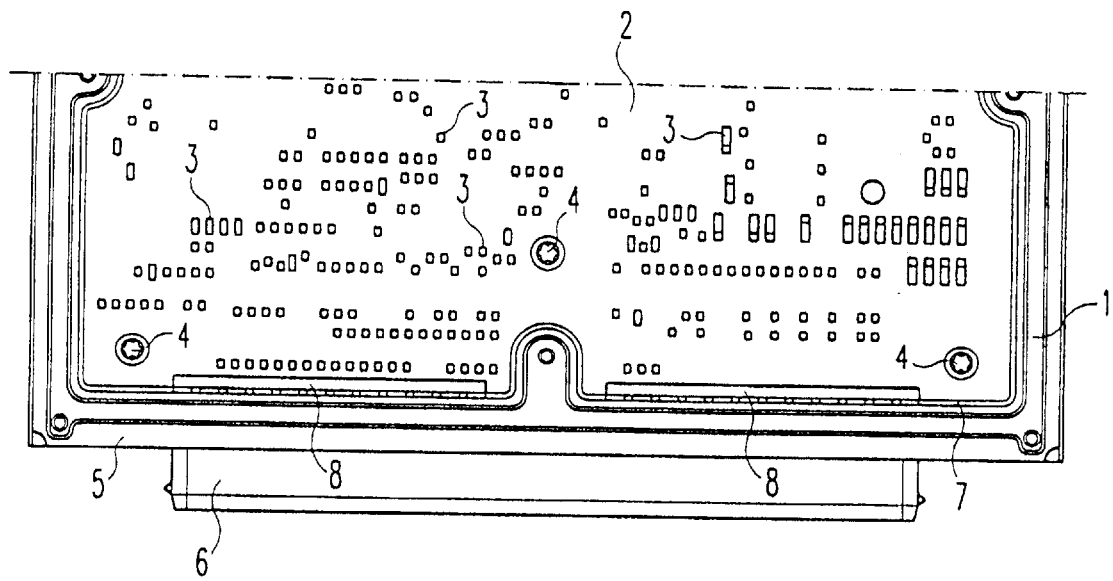
FIG. 1 is a diagrammatic plan view of an embodiment of a housing configuration constructed according to the invention.

Referring now to the figures of the drawings in detail and first, particularly, to FIG. 1 thereof, there is seen a structure of a motor control unit which is illustrated as an example of a housing configuration according to the invention. The motor control unit has a housing base body made of metal with side walls 1. A baseplate of the housing cannot be discerned in FIG. 1 since it is covered by a printed circuit board 2 with electrical components 3 fitted thereon. The printed circuit board 2 is spaced apart from the baseplate of the housing through the use of spacers 4. A housing connector 6 is provided on a longitudinal housing side wall 5. Pins of the housing connector 6 are connected to the circuitry of the printed circuit board 2 through non-illustrated contact wires.

A gap 7 is formed between a peripheral edge of the printed circuit board 2 and the housing side walls 1, 5. The gap 7 has a width which may be a few millimeters. Two spring profile elements 8 are inserted into the gap 7 in the region of the housing connector 6. The spring profile elements 8 establish an electrical connection between a ground terminal on the printed circuit board side and the metal housing, and consequently effect electromagnetic shielding of the housing configuration.

Figure 2:
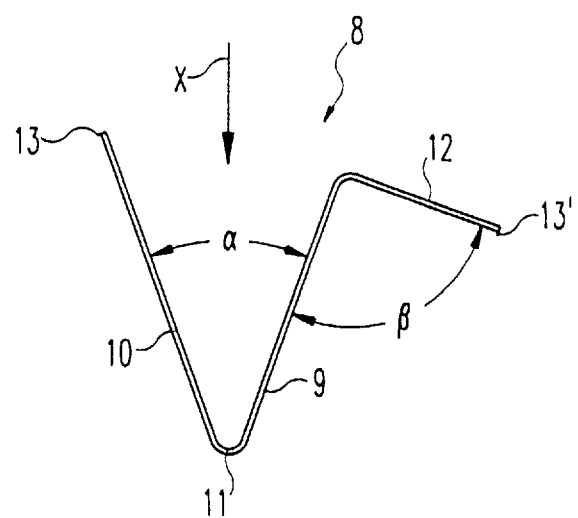
FIG. 2 is a cross-sectional view of a spring profile element of FIG. 1 before it is inserted into the housing configuration.

FIG. 2 shows a cross section of the spring profile element 8 in a non-loaded state, that is to say before it is fitted into the gap 7. The spring profile element 8 is formed of an elastic metal plate and has a first leg 9 and a second leg 10, which are connected to one another through a V-shaped bend 11. The two legs 9, 10 form an angle $\alpha$ which can be chosen depending on the size of the gap 7 to be bridged and is about 40° in the present case. The first leg 9 has an end remote from the bend 11 which extends into a stop piece 12. The stop piece 12 may have a length of about 3 millimeters and an angle $\beta$ between the stop piece 12 and the first leg 9 is about 90°.

FIG. 2 furthermore reveals a stamping direction which is indicated by an arrow X and subject to which the spring profile element 8 was stamped from a spring metal sheet beforehand. Due to the stamping, a respective knife edge-like, outwardly pointing burr 13, 13' is formed on longitudinal edges of the spring profile element 8.

Figure 3:
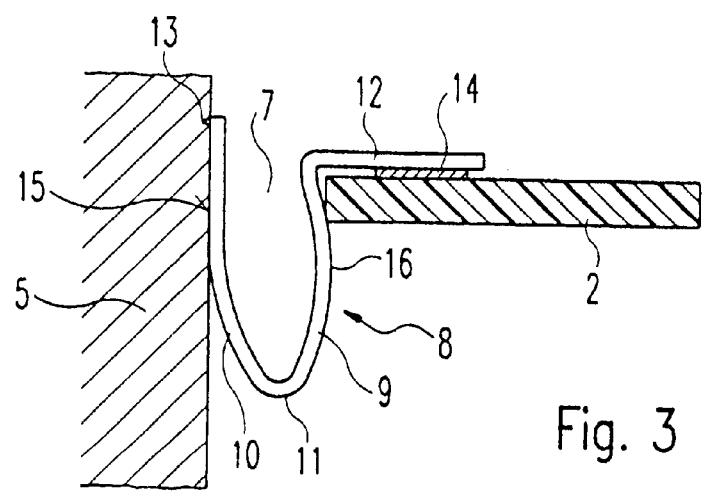
FIG. 3 is an enlarged, fragmentary, cross-sectional view of the spring profile element inserted into the housing configuration according to FIG. 1.

FIG. 3 shows the spring profile element 8 illustrated in FIGS. 1 and 2 when it is inserted in the housing. The stop piece 12 extends above the printed circuit board 2 and forms an electrical contact as it rests on a contact pad 14 representing a printed circuit board ground. The second profile leg 10 forms a contact area 15 as it bears against the housing side wall 5 over a large area. In this case, the second profile leg 10 is constructed to be longer than the first profile leg 9, with the result that it projects beyond a plane formed by the surface of the stop piece 12. This makes it possible to further enlarge the contact area 15, as a result of which a very small electrical contact resistance can be realized between the second profile leg 10 and the housing side wall 5.

The spring profile element 8 can be assembled in various ways. In the case of a first assembly sequence, the spring profile element 8 is soldered to the contact pad 14 of the printed circuit board 2 at the stop piece 12 before the printed circuit board 2 is inserted into the housing. The soldering can take place at the same time as the electrical components are soldered on, in a wave bath. The completed printed circuit board 2 is then introduced together with the soldered on spring profile element 8 into the housing and fixed there. In contrast, in the case of a second assembly sequence, the fully soldered printed circuit board 2 is firstly inserted into the housing and fixed and only afterwards are the spring profile elements 8 pressed into the gap 7 between the edge of the printed circuit board 2 and the housing side wall 5. In this case, a bulge 16 forms on the first profile leg 9 due to spreading tension of the spring element 8. The bulge 16 engages under the printed circuit board 2 and ensures robust latching of the spring profile element 8 in its end position, in combination with the stop piece 12, as is seen in FIG. 3. The spring profile element 8 can be pressed in through the use of an auxiliary tool provided with a thin blade. In the process, the burr 13 which is caused by stamping is pressed like a knife edge into the housing wall 5, thereby improving both the mechanical fixing and the electrical contact-making.

An essential advantage of this second assembly sequence is provided by the fact that it allows flexible refitting with spring profile elements. That is advantageous particularly when it is necessary to satisfy requirements with regard to EMC which are of different stringency nationally due to different legal regulations, for example.

Once the spring profile element 8 has been pressed into the gap 7, the stop piece 12 can still optionally be additionally soldered to the contact pad 14 by manual or machine soldering.

Figure 4:
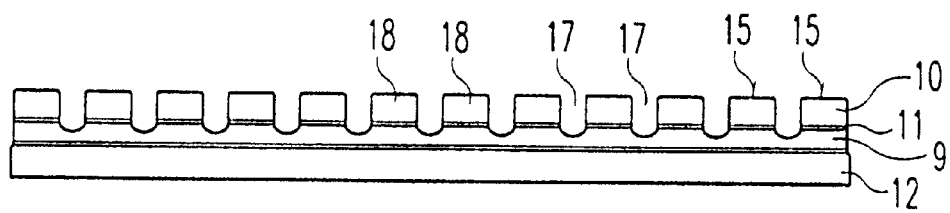
FIG. 4 is an enlarged plan view of the spring profile element of FIG. 1.

FIG. 4 shows the inserted spring profile element 8 of FIG. 3, in a plan view. The second profile leg 10 is subdivided into uniformly spaced-apart spring tabs 18 by transverse recesses 17 which are worked in on a edge side. The transverse recesses can extend beyond the bend 11 to a point in the first profile leg 9.

Figure 5:
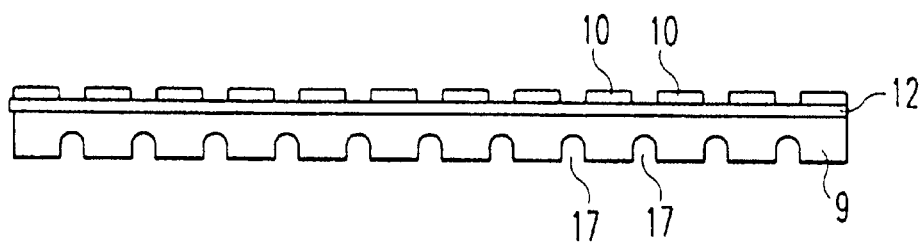
FIG. 5 is an enlarged elevational view of the spring profile element of FIG. 1, as seen from the viewing direction of the printed circuit board.

FIG. 5 shows the spring profile element 8 of FIG. 4 in an elevational view as seen from a viewing direction of the printed circuit board 2, which has been omitted in this figure for reasons of clarity. It becomes clear that, as already mentioned, the second profile leg 10 is constructed to be longer than the first profile leg 9 and projects above the plane defined by the stop piece 12.

We claim:

1. A housing configuration, comprising:
 a printed circuit board equipped with components and having an edge, end surfaces and a surface with a ground terminal;
 a housing having an at least partially metallic housing wall defining a gap region between said housing wall and the edge of the printed circuit board, said housing having at least one metallic spring profile element inserted into said gap region;
 said spring profile element having a first profile leg and a second profile leg connected to one another forming a substantially V-shaped profile cross section, said spring profile element including a stop piece connected to said first profile leg, said stop piece extending away from said first profile leg at an angle and seated in an electrically contact making manner on the around terminal of the printed circuit board; and
 said second profile leg exerting an elastic spreading force while bearing against and electrically contacting said housing wall.

2. The housing configuration according to claim 1, wherein said angle is substantially a right angle.

3. The housing configuration according to claim 1, wherein said first profile leg has a bulge engaging behind a lower surface of the printed circuit board, in an inserted state of said spring profile element.

4. The housing configuration according to claim 1, wherein said second profile leg has transverse recesses worked into said second profile leg from a longitudinal edge of said second profile leg.

5. The housing configuration according to claim 4, wherein said spring profile element has a leg bend, and said transverse recesses extend beyond said leg bend to a location in said first profile leg.

6. The housing configuration according to claim 1, wherein said housing has a side, and said second profile leg has a free end with a sharp-edged holding lip protruding on said side of said housing.

7. The housing configuration according to claim 6, wherein said holding lip is a burr produced by stamping.

8. The housing configuration according to claim 1, wherein said housing has a housing connector, and said spring profile element is disposed in the vicinity of said housing connector.

9. The housing configuration according to claim 1, wherein said stop piece is soldered to the ground terminal of the printed circuit board.

* * * * *